(12) United States Patent
Bürgi et al.

(10) Patent No.: US 6,293,317 B1
(45) Date of Patent: Sep. 25, 2001

(54) METHOD AND DEVICE FOR THE APPLICATION OF A LIQUID SUBSTANCE

(75) Inventors: Urs Bürgi, Aarberg; Otto Christen, Önsingen; Michael Schlunegger, Münsingen, all of (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 09/535,901

(22) Filed: Mar. 27, 2000

(30) Foreign Application Priority Data

Apr. 12, 1999 (CH) .................................................. 677/99

(51) Int. Cl.$^7$ ...................................................... B65B 1/04
(52) U.S. Cl. ............................ 141/283; 141/284; 141/250
(58) Field of Search .................................. 141/283, 284, 141/250, 268, 270, 232, 231, 248

(56) References Cited

U.S. PATENT DOCUMENTS

| 4,139,613 | 2/1979 | Hefele . |
| 4,678,015 | * 7/1987 | Raque et al. .......................... 141/131 |
| 4,733,594 | * 3/1988 | Bajohr ................................. 141/284 |
| 5,565,033 | 10/1996 | Gaynes et al. . |

* cited by examiner

*Primary Examiner*—Steven O. Douglas
(74) *Attorney, Agent, or Firm*—McCormick, Paulding & Huber LLP

(57) ABSTRACT

A device for the application of a liquid substance has a baseplate, in which at least one cavity is recessed, and a container. In operation, the container and the baseplate are moved relative to each other in such a way that during the relative movement the container passes from one side of the cavity to the other side of the cavity. Such a device is particularly suitable for the application of flux, electrically conducting epoxy or soldering paste onto the bumps of a semiconductor chip.

14 Claims, 1 Drawing Sheet

METHOD AND DEVICE FOR THE APPLICATION OF A LIQUID SUBSTANCE

BACKGROUND OF THE INVENTION

Figure 1:
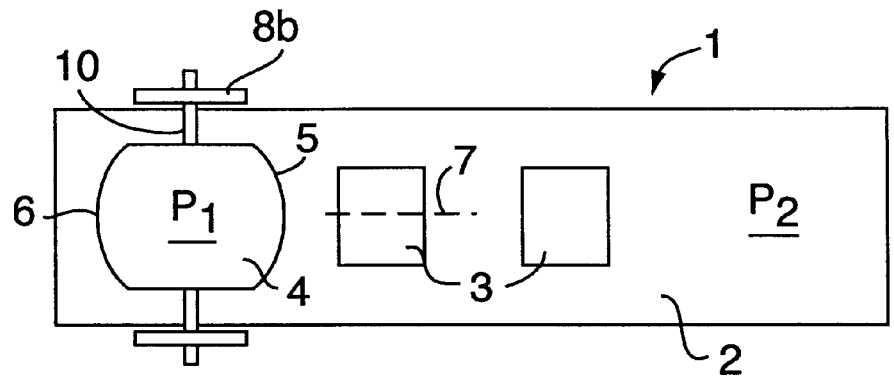

The invention concerns a method and a device for the application of a liquid substance onto an object, for example for the application of flux to the bumps of a semiconductor chip.

It is known, to provide a flat baseplate with a flux layer whereby the layer is applied by means of blades. With this process, a relatively large portion of the flux is lost.

The object of the invention is to improve the application of a liquid substance onto an object.

BRIEF DESCRIPTION OF THE INVENTION

The invention consists in using a device comprising a baseplate, in which at least one cavity is recessed, and a container, wherein in operation the container and the baseplate are moved relative to each other in such a way that during the relative movement the container passes from one side of the cavity to the other side of the cavity. This relative movement prohibits the generation of indentations in the surface of the flux. Furthermore no flux gets lost.

The invention is explained in detail below based on the drawing figures.

BRIEF DESCRIPTION OF THE DRAWING FIGURES

Figure 2:
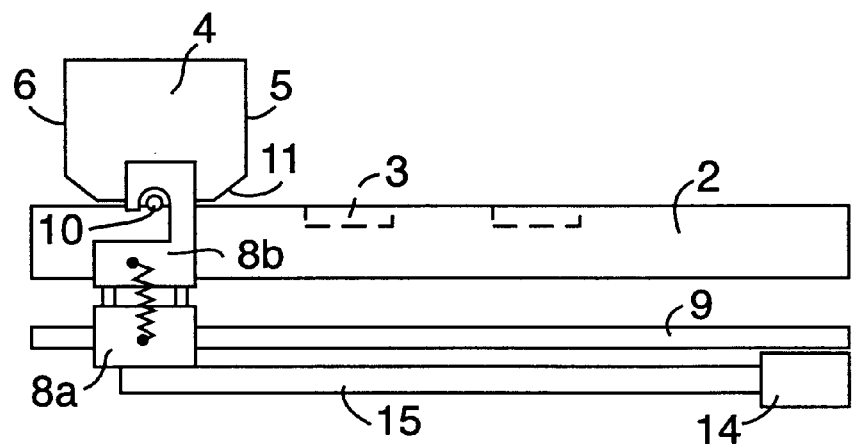

It is shown in:

FIG. 1 a plan view of a device for the application of a liquid substance,

FIG. 2 a side view of the device, and

Figure 3:
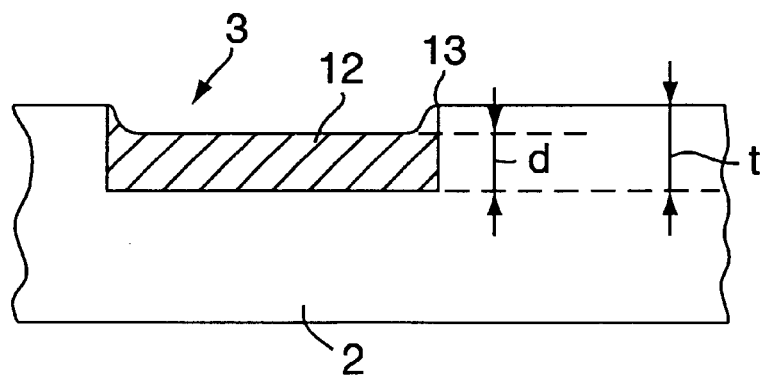

FIG. 3 a cavity filled with flux.

DETAILED DESCRIPTION OF THE INVENTION

FIGS. 1 and 2 show a plan view and a side view of a device 1 for the application of a liquid substance such as flux, electrically conducting expoxy or soldering paste onto an object, e.g. a semiconductor chip with bumps. The device 1 consists of an oblong baseplate 2, into which at least one cavity 3 is recessed and a container 4, open at the bottom, for acceptance of the liquid substance. In operation, the container 4 slides back and forth on the baseplate 2 at a predetermined speed between two positions $P_1$ and $P_2$, which are located to the left and right of the cavities 3. The front and rear walls 5 and 6 of the container 4, seen in the direction of movement, are designed round while the cavities 3 are square or rectangular. In this way, it is achieved that filling with the liquid substance begins and ends on the middle axis 7 of the cavity 3.

Drive of the container 4 is achieved, e.g. by means of a slide, onto which the container 4 is detachably fitted. The slide consists of a lower and an upper slide part 8a and 8b, respectively. The container 4 has two shafts 10 which are held in a circular recess in the upper part 8b of the slide. The upper part 8b of the slide is pulled by means of a spring against the lower part 8a of the slide in the direction towards the baseplate 2 so that the container 4 lies on the baseplate 2 with a predetermined force. The slide itself is moved back and forth along a guide rail 9 running parallel to the baseplate 2 by means of, for example, a pneumatic drive 14 via a rod 15, whereby the container 4 sliding on the baseplate 2 is moved with it. In order to achieve a high abrasion resistance, the baseplate 2 and the container 4 are preferably made from hardened chrome steel.

The shafts 10 attached to the container 4 are located almost in the sliding plane of the baseplate 2 so that the driving force exerted on the container 4 for the back and forth movement of the slide is applied in this sliding plane. In this way, it is achieved that the driving force is applied at the same level as the frictional forces effective between the container 4 and the baseplate 2. The driving force therefore exerts no torque on the container 4 so that the container 4 does not sway with the back and forth movement, ie, does not tip from one side to the other.

The front and rear walls 5 and 6 of the container 4 are formed on the outside with a slanted edge 11. With the movement of the container 4, the liquid substance banks up on the front edge 11 when seen in the direction of movement. The force exerted by the container 4 on the banked up liquid substance is vertical to the edge 11 and therefore, on moving over the cavity 3, presses the liquid substance downwards into the inside of the cavity 3. The front and rear walls 5 and 6 of the container 4 also have a slanted edge on the inside so that, when moving over the cavity 3, the liquid substance is also here pressed downwards towards the inside of the cavity 3.

FIG. 3 shows the cavity 3 filled with flux 12 as liquid substance. The thickness d of the flux layer is approximately 20 to 30 $\mu$m less than the depth t of the cavity 3, whereby however flux 12 reaches along the circumference of the cavity 3 up to the upper edge 13 of the cavity 3. Thanks to the invention, the cavity 3 is uniformly filled with flux 12, whereby the viscosity of the flux 12 makes no difference in a wide range of at least 8000 to 45000 cp. When immersing a semiconductor chip with bumps into the cavity 3, all bumps are therefore equally wetted with flux.

As it is only a matter of the relative movement between the container 4 (FIG. 1) and the baseplate 2, it is also possible, with the device for the application of a liquid substance presented in FIG. 1, to arrange the container 4 stationary and to move the baseplate 2 back and forth. With a further embodiment, the back and forth movement of the baseplate 2 can be replaced by a rotational movement whereby the baseplate 2 would then be a circular disc with the recessed cavities 3 which is rotated around its centre point.

We claim:

1. A method for the application of a liquid substance to an object, wherein a container, open at the bottom, holding a liquid substance to be deposited in a cavity which is recessed in a baseplate and the baseplate are moved relative to each other such that during the relative movement the container slides on the baseplate from a first position located at one side of the cavity to a second position located at the opposite side of the cavity.

2. A method in accordance with claim 1, wherein the baseplate is stationary and the container slides back and forth on the baseplate.

3. A method in accordance with claim 2, wherein a driving force is exerted on the container which is applied in the sliding plane of the baseplate.

4. A method in accordance with claim 1, wherein the container is stationary and the baseplate is moved.

5. A device for the application of a liquid substance to an object, comprising a baseplate with a cavity and a container, open at the bottom, holding a liquid substance to be deposited in the cavity, the container and the baseplate being movable relative to each other such that the container slides on the baseplate from one side of the cavity to the opposite side of the cavity during the relative movement.

6. A device in accordance with claim 5, wherein the baseplate is stationary and a drive exerts a driving force on the container to slide the container back and forth on the baseplate between a first position located at the one side of the cavity and a second position located at the opposite side of the cavity.

7. A device in accordance with claim 6, wherein the driving force exerted on the container by the drive is applied in the sliding plane of the baseplate.

8. A device in accordance with claim 7, wherein a front wall and a rear wall of the container are formed on an outside with a slanting edge.

9. A device in accordance with claim 6, wherein a front wall and a rear wall of the container are formed on an outside with a slanting edge.

10. A device in accordance with claim 5, wherein the container is stationary and a drive moves the baseplate.

11. A device in accordance with claim 10, wherein a front wall and a rear wall of the container are formed on an outside with a slanting edge.

12. A device in accordance with claim 5, wherein a front wall and a rear wall of the container are formed on an outside with a slanting edge.

13. A device in accordance with claim 5, further comprising:
    a slide including a lower part and an upper part, wherein the upper part holds the container and wherein the upper part is pulled against the lower part by means of a spring in order to press the container against the baseplate, and
    a drive for moving the lower part of the slide back and forth between the first position located at the one side of the cavity and the second position located at the opposite side of the cavity.

14. A device in accordance with claim 13, wherein the upper part of the slide comprises a recess for holding a shaft of the container, the shaft being located in the sliding plane of the baseplate.

* * * * *